United States Patent
Wang et al.

(10) Patent No.: US 9,742,402 B1
(45) Date of Patent: Aug. 22, 2017

(54) KEYSWITCH AND KEYBOARD WITH DISTANCE DETECTING FUNCTION

(71) Applicant: PixArt Imaging Inc., Hsin-Chu (TW)

(72) Inventors: Tsung-Fa Wang, Hsin-Chu (TW);
Yen-Min Chang, Hsin-Chu (TW);
Feng-Cheng Yang, Hsin-Chu (TW);
Shih-Wei Kuo, Hsin-Chu (TW)

(73) Assignee: PixArt Imaging Inc., Hsin-Chu (TW)

( * ) Notice: Subject to any disclaimer, the term of this patent is extended or adjusted under 35 U.S.C. 154(b) by 0 days.

(21) Appl. No.: 15/175,053

(22) Filed: Jun. 7, 2016

(30) Foreign Application Priority Data

Feb. 24, 2016 (TW) .............................. 105105392 A (51) Int. Cl.
*H03K 17/96* (2006.01)
*H01H 13/14* (2006.01)

(52) U.S. Cl.
CPC ......... *H03K 17/9629* (2013.01); *H01H 13/14* (2013.01); *H03K 17/9622* (2013.01); *H03K 17/9631* (2013.01); *H03K 17/9647* (2013.01)

(58) Field of Classification Search
CPC ........... H03K 17/9629; H03K 17/9622; H03K 17/9631; H03K 17/9647; H01H 13/14

USPC ......................... 200/5 A, 600, 329, 341–345
See application file for complete search history.

(56) References Cited

U.S. PATENT DOCUMENTS

| | | | | |
|---|---|---|---|---|
| 4,849,852 A | * | 7/1989 | Mullins | H01G 5/0138 200/517 |
| 6,809,278 B2 | * | 10/2004 | Tsubaki | H01H 3/12 200/314 |
| 8,735,755 B2 | * | 5/2014 | Peterson | H03K 17/962 200/600 |

* cited by examiner

*Primary Examiner* — Edwin A. Leon
(74) *Attorney, Agent, or Firm* — Winston Hsu (57) ABSTRACT

A keyboard with a distance detecting function includes a plurality of keyswitches, and each keyswitch includes a keycap, a base, a supporting component, a recovering component and a distance detecting unit. The base has a guide slot structure. The supporting component has a first end connecting to the keycap, and a second end movably assembled with the guide slot structure. The recovering component is disposed between the supporting component and the guide slot structure. The distance detecting unit is detachably disposed on the base, and adapted to detect a movement of the keycap relative to the base for determining whether the keyswitch is actuated.

27 Claims, 8 Drawing Sheets

KEYSWITCH AND KEYBOARD WITH DISTANCE DETECTING FUNCTION

BACKGROUND OF THE INVENTION

1. Field of the Invention

The present invention relates to a keyswitch and a keyboard, and more particularly, to a keyswitch and a keyboard with the distance detecting function.

2. Description of the Prior Art

A conventional mechanical keyswitch includes a base, a keycap, a recovering component and an actuating spring. The recovering component is disposed on the base, the keycap is installed on the recovering component, and the keycap can be vertically moved relative to the base via manual pressure. The actuating spring is disposed by the keycap. The keycap moves relative to the base to contact the actuating spring while arrives a specific position, and the actuating spring drives an electronic switch to output a control command corresponding to the mechanical keyswitch. The actuating spring further provides a resilient recovering force to the keycap for hand feeling. However, the electronic switch of the conventional mechanical keyswitch is actuated by pressing the keycap to deform the actuating spring, and deformation of the actuating spring is able to actuate the electronic switch since a relative movement between the keycap and the base is greater than a specific distance, so that the mechanical keyswitch has long operation stroke and large structural volume and is unsuitable for consumer thin-typed electronic product.

SUMMARY OF THE INVENTION

The present invention provides a keyswitch and a keyboard with the distance detecting function for solving above drawbacks.

According to the claimed invention, a keyswitch with a distance detecting function includes a keycap, a base, a supporting component, a recovering component and a distance detecting unit. A guide slot structure is disposed on the base. The supporting component has a first end and a second end opposite to each other, the first end is connected to the keycap and the second end is movably assembled with the guide slot structure. The recovering component is disposed between the supporting component and the guide slot structure. The distance detecting unit is detachably disposed on the base and adapted to detect a movement of the keycap relative to the base for determining whether the keyswitch is actuated.

According to the claimed invention, a keyboard with a distance detecting function includes a base and a plurality of keyswitches disposed on the base. A plurality of guide slot structures is formed on the base. The keyswitch includes a keycap, a supporting component, a recovering component and a distance detecting unit. The supporting component has a first end and a second end opposite to each other, the first end is connected to the keycap and the second end is movably assembled with the guide slot structure. The recovering component is disposed between the supporting component and the guide slot structure. The distance detecting unit is detachably disposed on the base and adapted to detect a movement of the keycap relative to the base for determining whether the keyswitch is actuated.

The keyswitch and the related keyboard of the present invention utilize the distance detecting unit having the distance detecting function to detect the relative movement between the keycap and the base. The keyswitch is represented as being accidently hit while vary quantity of the movement is lower than the threshold, and the keyswitch is represented as being purposely actuated while the vary quantity of the movement is greater than the threshold. The present invention can adjust a value of the threshold to control the detective sensitivity of the distance detecting function of the keyswitch; for example, the small threshold means the keyswitch can be actuated by slight touch, and the large threshold means that the keyswitch is actuated by heavy pressure. Because the distance detecting unit accurately detects the relative movement between the keycap and the base, the present invention further can utilize the distance detecting unit to analyze the varying quantity and/or stop timing of the foresaid movement, and determine whether the keyswitch is pressed by continued touch, transient touch or intermittent touch, so as to drive the keyswitch to output the control command corresponding to different touch condition for various hand feeling.

In addition, the present invention disposes the plurality of keyswitches on the keyboard, and each of the keyswitches has the distance detecting function. The detective precision and sensitivity of the distance detecting function is varied according to the predetermined threshold (which is utilized to compare with the movement of the keycap) of the distance detecting unit, so the user can arbitrarily set the threshold to adjust the detective precision and sensitivity of the keyswitch, and preferably the detective precision and sensitivity of the whole keyswitches on the keyboard are simultaneously adjusted by specific correctional function before selling. Comparing to the prior art, the present invention replaces an actuating spring of the conventional mechanical keyswitch with the distance detecting unit, not only can optionally adjust the detective precision and sensitivity of the keyswitch, but also effectively decrease structural volume of the keyswitch for applying to the consumer thin-typed electronic product.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
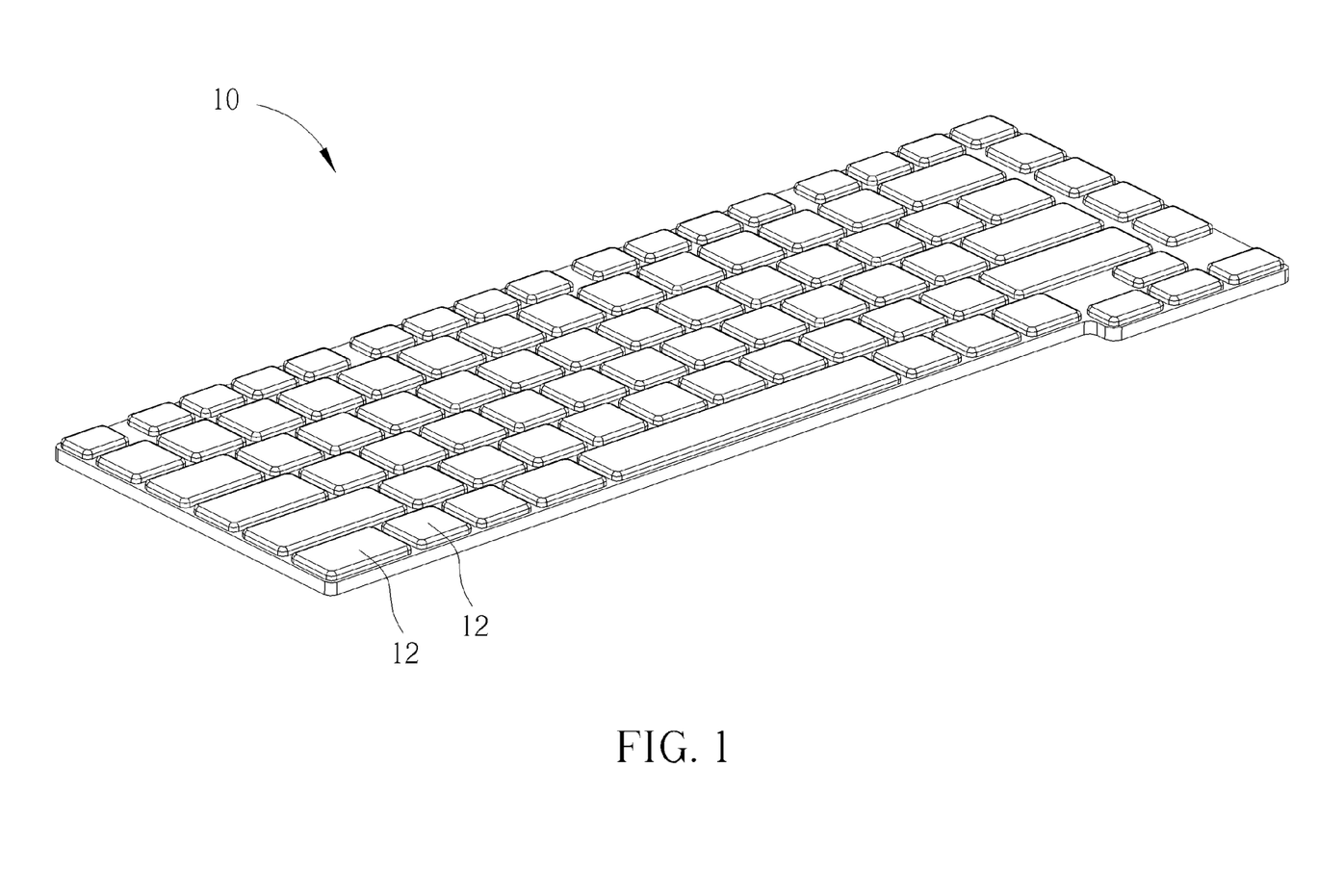
FIG. 1 is a diagram of a keyboard according to an embodiment of the present invention.
Figure 2:
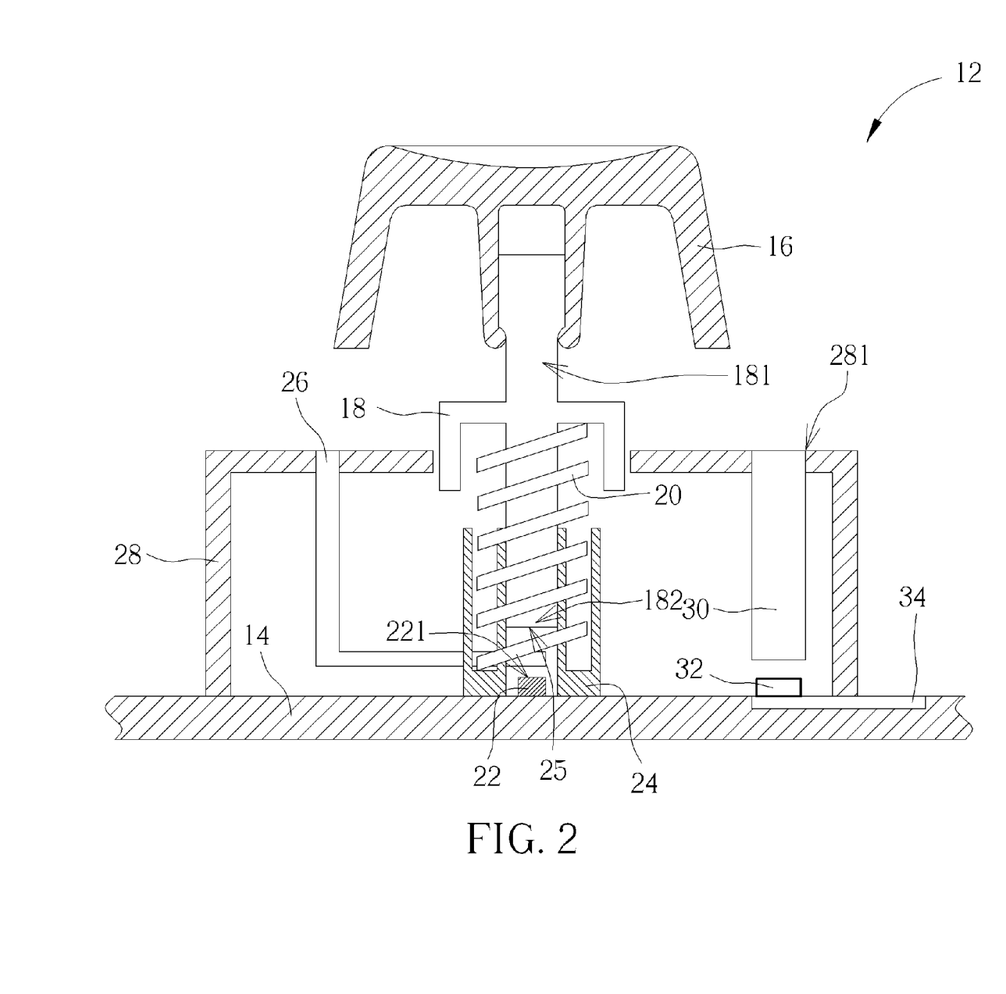
FIG. 2 and FIG. 3 respectively are sectional views of a keyswitch in different operation modes according to a first embodiment of the present invention.
Figure 3:
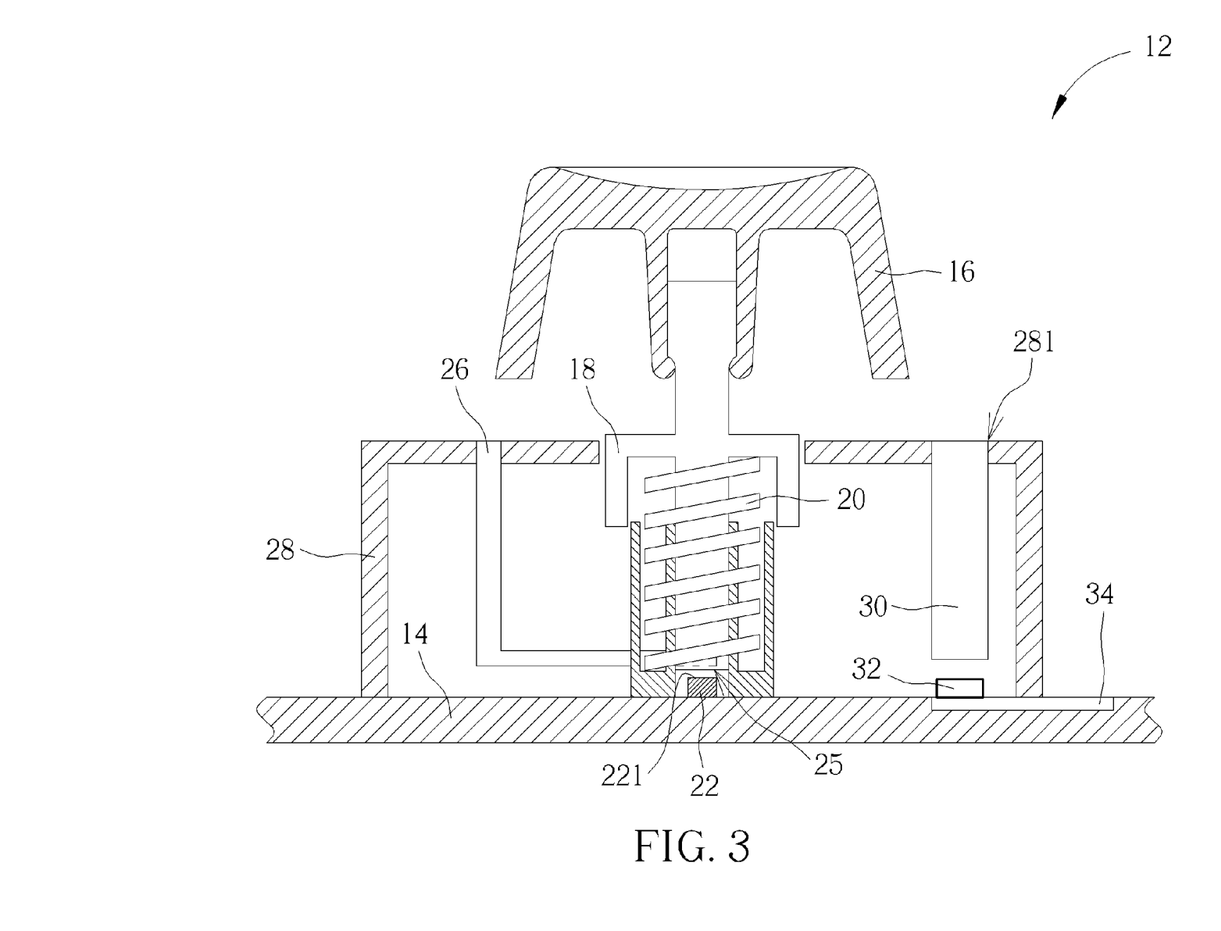

Please refer to FIG. 1 to FIG. 3. FIG. 1 is a diagram of a keyboard 10 according to an embodiment of the present invention. FIG. 2 and FIG. 3 respectively are sectional views of a keyswitch 12 in different operation modes according to a first embodiment of the present invention. The keyboard 10 may have a plurality of keyswitches 12, and each of the keyswitches 12 has distance detecting function and may be have any specific type according to design demand. The keyswitch 12 includes a base 14, a keycap 16, a supporting component 18, a recovering component 20, a distance detecting unit 22 and a sheltering component 28. The base 14 is a circuit board disposed inside the keyboard 10. The keycap 16 is an interface where the user presses; a symbol mark is printed on the keycap 16 to distinguish the symbol command of the keyswitch 12. The keycap 16 can be made of light penetrating material. The supporting component 18 has a first end 181 and a second end 182 opposite to each other. The supporting component 18 passes through the sheltering component 28 to connect the first end 181 with the keycap 16 and to movably assemble the second end 182 with a corresponding guide slot structure 24 of the base 14, so that the keycap 16 can be vertically moved relative to the base 14.

The recovering component 20 is disposed between the supporting component 18 and the guide slot structure 24; the recovering component 20 usually can be, but not limited to, a compression spring. While an external force applied to the keycap 16 is removed, a resilient recovering force of the recovering component 20 recovers the keycap 16 to an initial position. The distance detecting unit 22 is detachably disposed on the base 14, and the user can replace the distance detecting unit 22 with different standards according to detective sensitivity's demand of the keyswitch 12. The distance detecting unit 22 is utilized to detect a movement of the keycap 16 relative to the base 14; for example, the keyswitch 12 is actuated while the movement of the keycap 16 is larger than a threshold, and the keyswitch 12 is accidently hit but not actuated while the movement of the keycap 16 is smaller than the threshold. Therefore, the detective sensitivity of the keyswitch 12 can be adjusted by the distance detecting unit 22. In the first embodiment, the distance detecting unit 22 is an optical detecting component disposed inside the guide slot structure 24, and a detecting surface 221 of the distance detecting unit 22 faces toward a bottom surface of the supporting component 18. The bottom surface of the supporting component 18 is defined as a working surface 25, and a characteristic pattern is formed on the working surface 25. While the supporting component 18 is moved inside the guide slot structure 24, the distance detecting unit 22 can determine the movement of the keycap 16 relative to the base 14 according to deformation of the detected characteristic pattern.

The distance detecting unit 22 executes the distance detecting function by optical detection technique in the above-mentioned embodiment; however, the present invention further can utilize the resistance detecting component or the capacitance detecting component to be the distance detecting unit 22. While the supporting component 18 approaches, the distance detecting unit 22 having resistance detecting function detects whether an electrode disposed on the bottom surface (such like the working surface 25) of the supporting component 18 is in conduction for actuation of the keyswitch 12 while the supporting component 18 approaches, and the distance detecting unit having capacitance detecting function determines whether to actuate the keyswitch 12 according to an induced current resulted by capacitance variation.

As shown in FIG. 2, the keycap 16 is not pressed by the external force, the recovering component 20 holds the supporting component 18 at the initial position (the higher position), the working surface 25 is distant from the distance detecting unit 22, and the distance detecting unit 22 acquires a detecting result about the characteristic pattern with small size. As shown in FIG. 3, the keycap 16 is pressed by the external force to move the supporting component 18 relative to the base 14 downwardly, the working surface 25 moves close to the distance detecting unit 22, and the distance detecting unit 22 acquires the detecting result about the characteristic pattern with large size. That is, the distance detecting unit 22 can determine the movement of the keycap 16 relative to the base 14 according to the deformation of the characteristic pattern. The keyboard 10 may have an independent processing unit adapted to receive the detecting result of the whole distance detecting units 22 for analysis, or the distance detecting unit 22 may have own processing function for detecting and analyzing the characteristic pattern.

The keyboard 10 of the present invention can utilize the optical detecting function to decide whether the keyswitch 12 is accidently hit or purposely actuated. In addition, the keyswitch 12 may have light emitting function, which controls lighting property of the light emitting unit according to actuation of the keyswitch 12 and/or user's gesture above the keyboard 10. The supporting component 18 can be selectively made of light guiding material; meanwhile, the distance detecting unit 22 not only detects variation of the characteristic pattern on the working surface 25, but also receives environmental intensity variation outside the keycap 16 via the supporting component 18 with light guiding function. For example, the environmental intensity changed from the high level to the low level represents that an external object is located above the keyswitch 12, and the environmental intensity changed from the low level to the high level represents that the external object moves away from the keyswitch 12. Moreover, the keyswitch 12 can include a light guiding component 26, an end of the light guiding component 26 aligns with the distance detecting unit 22, and the other end of the light guiding component 26 passes through the sheltering component 28 to point out the keycap upwardly. The distance detecting unit 22 can receive the environmental intensity variation outside the keycap 16 via the light guiding component 26, to determine position of the external object relative to the keyswitch 12.

Generally, the keyswitch 12 can detect the environmental intensity by one of the supporting component 18 made by the light guiding material and the light guiding component 26, but the keyswitch 12 further may include the supporting component 18 and the light guiding component 26 both according to design demand. As shown in FIG. 1, the keyswitches 12 of the keyboard 10 have the environmental intensity detecting function; while the user's hand moves across the keyboard 10, the plurality of keyswitches arranged as an array can respectively detect the environmental intensity variation resulted by the user's hand moving across the keyboard 10, which means directions, speed and track of the gesture can be distinguished to generate the corresponding control command.

The keyswitch 12 further can include a light guiding component 30 and a light emitting unit 32. An end of the light guiding component 30 inserts into an opening 281 on the sheltering component 28, and the light emitting unit 32 is disposed on the base 14 to align with the other end of the light guiding component 30. Light generated by the light emitting unit 32 can be transmitted out of the sheltering component 28 via the light guiding component 30, and the user can watch the light over the keyswitch 12. The keyswitch 12 further can include a light penetrating structure 34 disposed on the base 14 and stretching out of the sheltering component 28. The light emitting unit 32 aligns with the light penetrating structure 34, and the light generated by the light emitting unit 32 is transmitted out of the base 14 via the light penetrating structure 34, so the user can watch the light through a gap between the adjacent keyswitches 12. Because of the above-mentioned gesture detecting function, the present invention can drive the specific keyswitch 12 to light on (such like reminder radiation or decorative radiation) according to the gesture's track moving across the keyboard 10; for instance, the reminder radiation and/or the decorative radiation can be shined through the keycap 16 of the keyswitch 12, or through the base between the adjacent keyswitches 12

In the first embodiment of the present invention, the distance detecting unit 22 (which means the optical detecting component) not only detects the characteristic pattern formed on the working surface 25 of the supporting component 18, but also can determine the movement of the keycap 16 relative to the base 14 according to the reflective intensity variation of the working surface 25. For example, the reflective intensity of the working surface 25 is decreased while the working surface 25 is distant from the distance detecting unit 22, as shown in FIG. 2; and the reflective intensity of the working surface 25 is increased while the working surface 25 moves close to the distance detecting unit 22, as shown in FIG. 3. The distance detecting unit 22 analyzes the reflective intensity variation of the working surface 25 to acquire the movement the keycap 16 relative to the base 14, so as to determine whether the keyswitch 12 is actuated accordingly.

Figure 4:
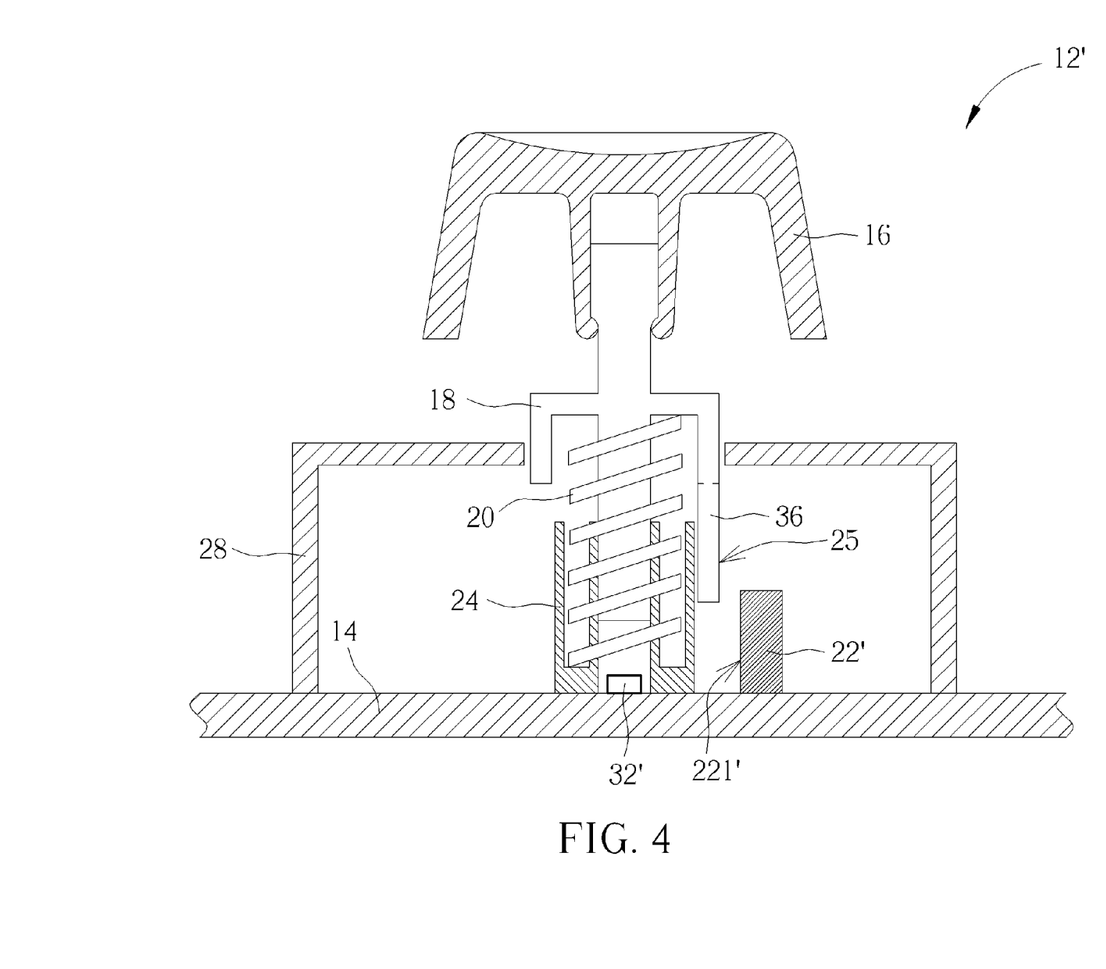
FIG. 4 and FIG. 5 respectively are sectional views of the keyswitch in different operation modes according to a second embodiment of the present invention.
Figure 5:
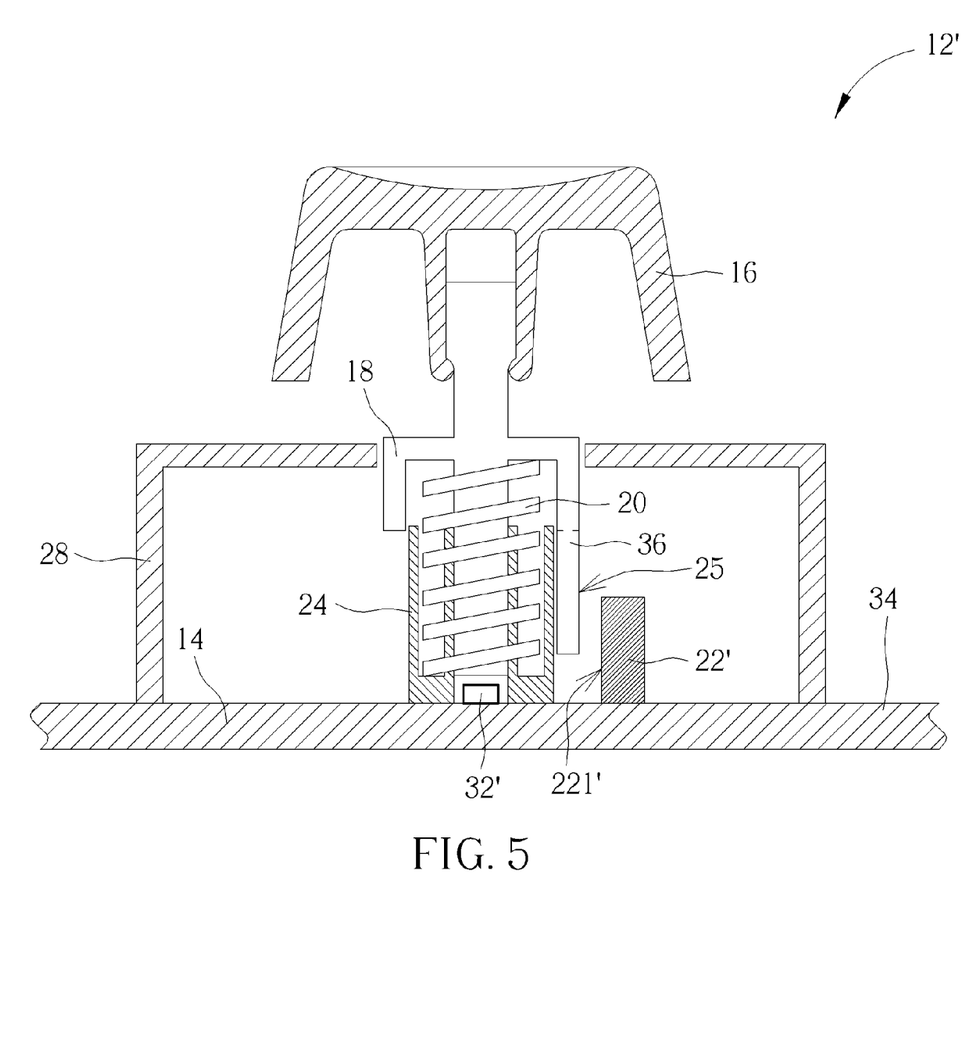
Figure 6:
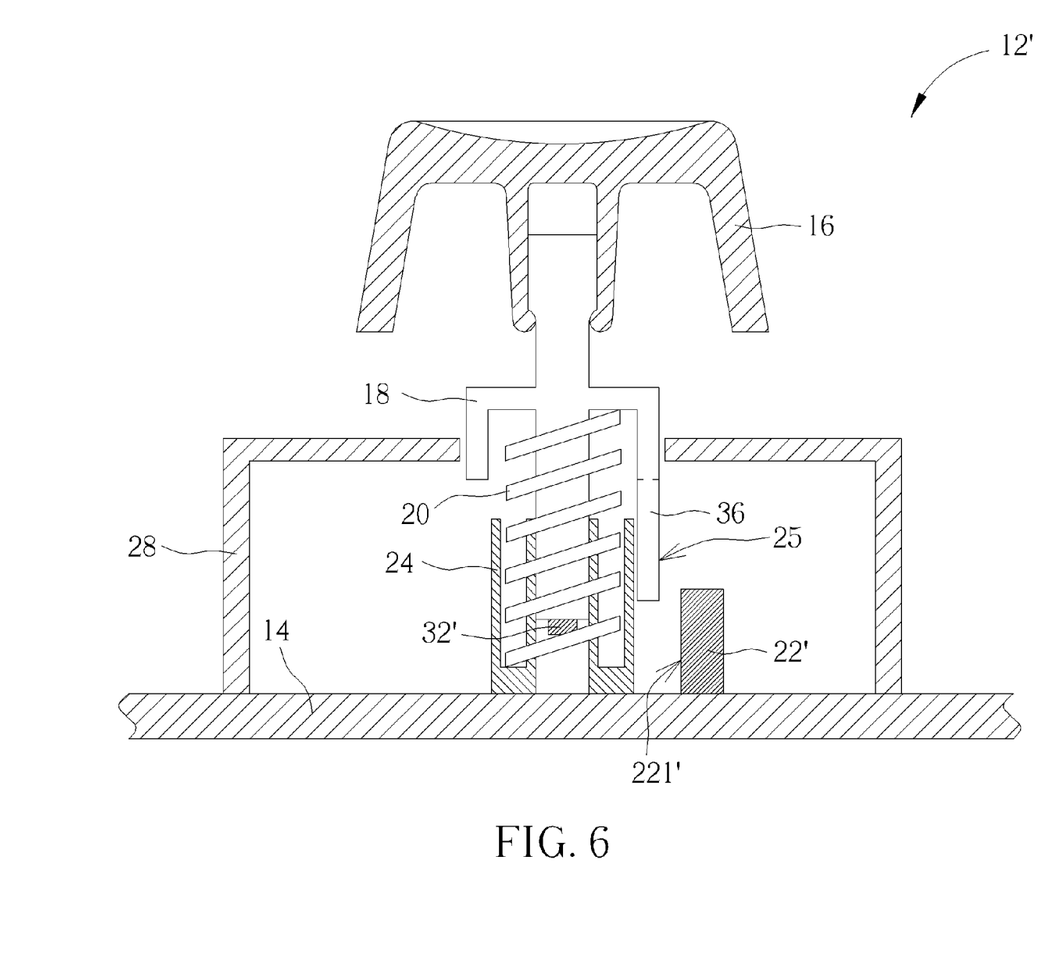
FIG. 6 is a sectional view of the keyswitch in another form according to the second embodiment of the present invention.

Please refer to FIG. 4 and FIG. 5. FIG. 4 and FIG. 5 respectively are sectional views of the keyswitch 12' in different operation modes according to a second embodiment of the present invention. In the second embodiment, elements having the same numerals as ones of the first embodiment have the same structures and functions. Difference between the first embodiment and the second embodiment is that the supporting component 18 includes a stretching portion 36, and the working surface 25 is formed on the stretching portion 36. The distance detecting unit 22' of the keyswitch 12' is located outside the guide slot structure 24, and the detecting surface 221' of the distance detecting unit 22' faces toward the working surface 25 of the stretching portion 36. While the keyswitch 12 is pressed to move the supporting component 18 relative to the guide slot structure 24, the distance detecting unit 22' detects a motion of the characteristic pattern on the working surface 25 to acquire the relative movement between the keycap 12 and the base 14. The light emitting unit 32' of the keyswitch 12' is disposed inside the guide slot structure 24 of the base 14. The light emitting unit 32' aligns with the supporting component 18, and the light generated by the light emitting unit 32' can be transmitted out of the keycap 16 via the supporting component 18 (which is made of the light guiding material). Please refer to FIG. 6. FIG. 6 is a sectional view of the keyswitch 12' in another form according to the second embodiment of the present invention. The light emitting unit 32' can be selectively disposed on the second end 182 of the supporting component 18, the light emitting unit 32' can be moved with the supporting component 18 moving relative to the guide slot structure 24, and the light generated by the light emitting unit 32' is transmitted out of the keycap 16 via the supporting component 18 (which is made of the light guiding material).

Figure 7:
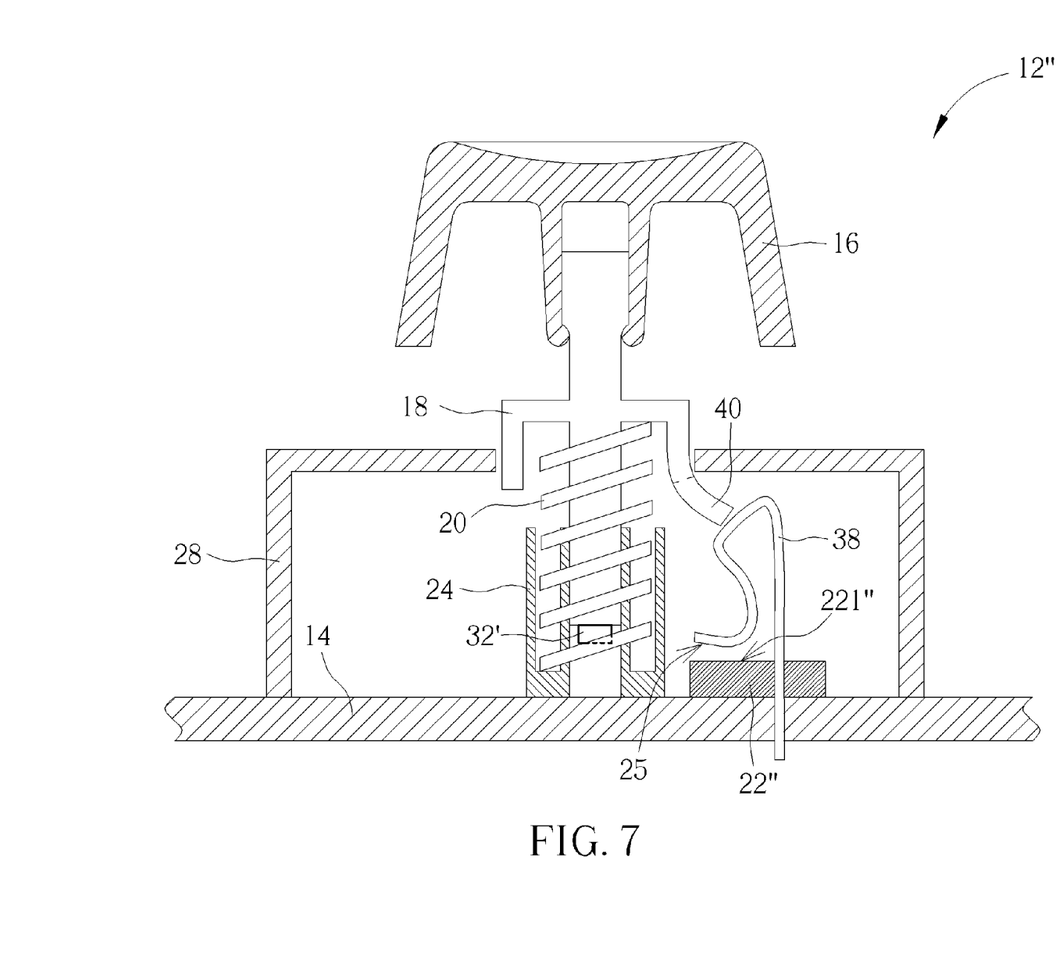
FIG. 7 and FIG. 8 respectively are sectional views of the keyswitch in different operation modes according to a third embodiment of the present invention.
Figure 8:
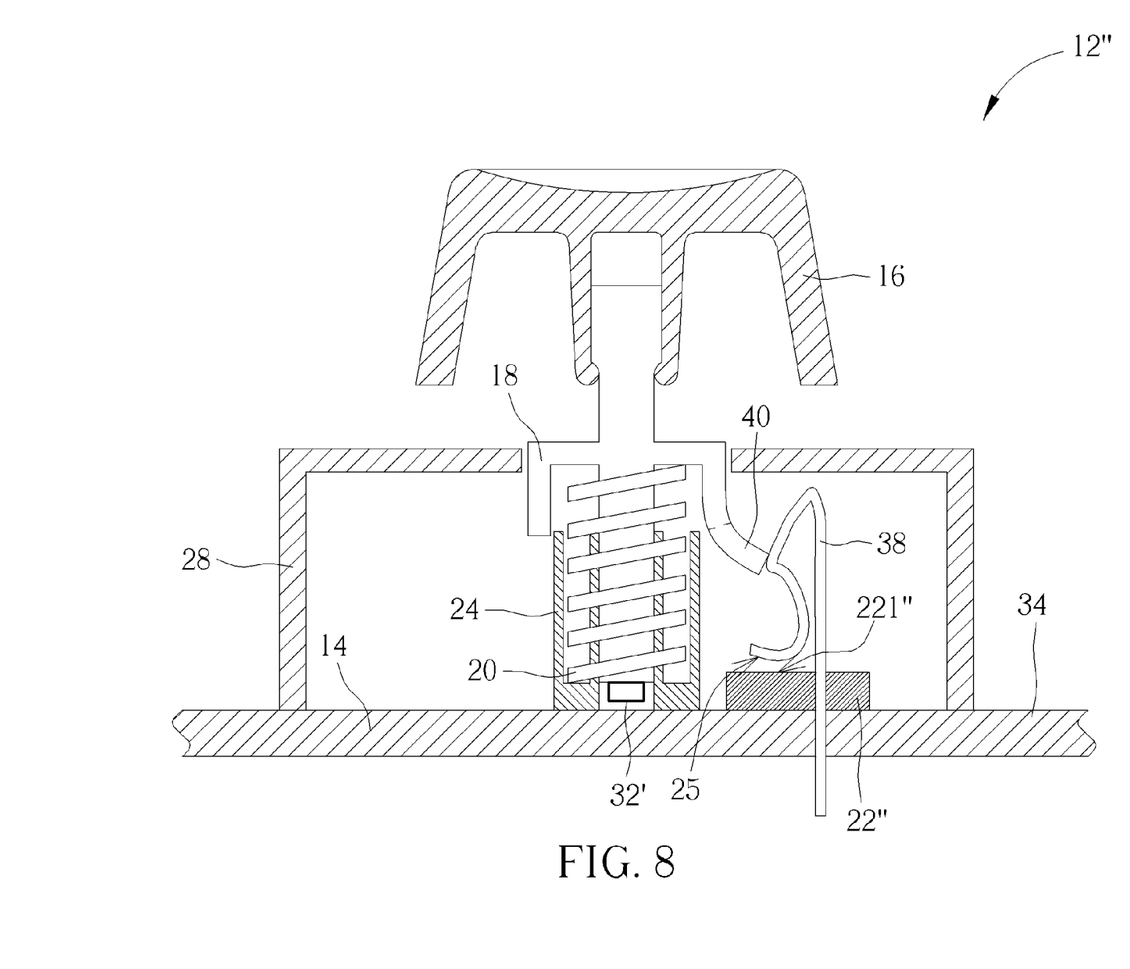

Please refer to FIG. 7 and FIG. 8. FIG. 7 and FIG. 8 respectively are sectional views of the keyswitch 12" in different operation modes according to a third embodiment of the present invention. In the third embodiment, elements having the same numerals as ones of the above-mentioned embodiments have the same structures and functions. Difference between the third embodiment and the above-mentioned embodiments is that the keyswitch 12" further includes a resilient component 38 disposed on the base 14 and adjacent by the supporting component 18, and a pushing portion 40 of the supporting component 18 detachably contacts against the resilient component 38. The working surface 25 is formed on the resilient component 38, the detecting surface 221" of the distance detecting unit 22" faces toward the working surface 25 of the resilient component 38, and the motion of the characteristic pattern on the working surface 25 can be detected accordingly while the resilient component 38 is resiliently deformed. As shown in FIG. 7, while the keycap 16 is not pressed by the external force, the pushing portion 40 may not directly touch the resilient component 38, or may contact against the resilient component 38 but the resilient component 38 has no giant deformation; as shown in FIG. 8, while the keycap 16 is pressed by the external force, the keycap 16 and the supporting component 18 simultaneously move downward, the pushing portion 40 presses the resilient component 38 to generate a resilient recovering force, position of the working surface 25 is varied and the distance detecting unit 22" can detect the movement of the keycap 16 relative to the base 14 according to the motion of the characteristic pattern on the working surface 25. During deformation of the resilient component 38, the resilient recovering force of the resilient component 38 is applied to the supporting component 18 via the pushing portion 40, and the user can experience force feedback while pressing the keyswitch 12.

The light emitting unit 32' of the keyswitch 12" can be disposed on the base 14 or the second end 182 of the supporting component 18, and the light generated by the light emitting unit 32' is transmitted out of the keycap 16 via the supporting component 18 made of light guiding material. Furthermore, the keyswitch 12' of the second embodiment and the keyswitch 12" of the third embodiment may selectively have the light guiding component 26, the light guiding component 30 and/or the light penetrating structure 34 mentioned in the first embodiment for transmitting the light generated by the light emitting unit 32' out of the keycap 16 or the base 14.

In conclusion, the keyswitch and the related keyboard of the present invention utilize the distance detecting unit having the distance detecting function to detect the relative movement between the keycap and the base. The keyswitch is represented as being accidently hit while vary quantity of the movement is lower than the threshold, and the keyswitch is represented as being purposely actuated while the vary quantity of the movement is greater than the threshold. The present invention can adjust a value of the threshold to control the detective sensitivity of the distance detecting function of the keyswitch; for example, the small threshold means the keyswitch can be actuated by slight touch, and the large threshold means that the keyswitch is actuated by heavy pressure. Because the distance detecting unit accurately detects the relative movement between the keycap and the base, the present invention further can utilize the distance detecting unit to analyze the varying quantity and/or stop timing of the foresaid movement, and determine whether the keyswitch is pressed by continued touch, transient touch or intermittent touch, so as to drive the keyswitch to output the control command corresponding to different touch condition for various hand feeling.

It should be mentioned that the present invention disposes the plurality of keyswitches on the keyboard, and each of the keyswitches has the distance detecting function. The detective precision and sensitivity of the distance detecting function is varied according to the predetermined threshold (which is utilized to compare with the movement of the keycap) of the distance detecting unit, so the user can arbitrarily set the threshold to adjust the detective precision and sensitivity of the keyswitch, and preferably the detective precision and sensitivity of the whole keyswitches on the keyboard are simultaneously adjusted by specific correctional function before selling. Comparing to the prior art, the present invention replaces an actuating spring of the conventional mechanical keyswitch with the distance detecting unit, not only can optionally adjust the detective precision and sensitivity of the keyswitch, but also effectively decrease structural volume of the keyswitch for applying to the consumer thin-typed electronic product.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A keyswitch with a distance detecting function, the keyswitch comprising:
   a keycap;
   a base whereon a guide slot structure is disposed;
   a supporting component, having a first end and a second end opposite to each other, the first end being connected to the keycap and the second end being movably assembled with the guide slot structure;
   a recovering component disposed between the supporting component and the guide slot structure; and
   a distance detecting unit detachably disposed on the base and adapted to detect a movement of the keycap relative to the base for determining whether the keyswitch is actuated.

2. The keyswitch of claim 1, wherein the distance detecting unit is an optical detecting component, the optical detecting component detects a characteristic pattern on a working surface, and determines the movement of the keycap relative to the base according to a motion of the characteristic pattern, a deformation of the characteristic pattern or a reflective intensity variation of the working surface.

3. The keyswitch of claim 2, wherein the optical detecting component receives an environmental intensity variation outside the keycap via a light guiding component, so as to determine whether an external object is located above the keycap.

4. The keyswitch of claim 2, wherein the working surface is formed on a bottom surface of the supporting component, the distance detecting unit is disposed inside the guide slot structure, and a detecting surface of the distance detecting unit faces toward the bottom surface.

5. The keyswitch of claim 2, wherein the supporting component further has a stretching portion, the working surface is formed on the stretching portion, and a detecting surface of the distance detecting unit faces toward the stretching portion.

6. The keyswitch of claim 2, wherein the supporting component further has a pushing portion, the keyswitch further comprises a resilient component disposed on the base and detachably contacting against the pushing portion, a resilient recovering force of the resilient component is applied to the supporting component via the pushing portion.

7. The keyswitch of claim 6, wherein the working surface is formed on the resilient component, and a detecting surface of the distance detecting unit faces toward the resilient component.

8. The keyswitch of claim 1, further comprising:
   a light penetrating structure disposed on the base; and
   a light emitting unit aligning with the light penetrating structure, light generated by the light emitting unit being transmitted out of the base via the light penetrating structure.

9. The keyswitch of claim 1, wherein the supporting component is made of light guiding material, the keyswitch further comprises a light emitting unit aligning with the supporting component, and light generated by the light emitting unit is transmitted out of the keycap via the supporting component.

10. The keyswitch of claim 9, wherein the light emitting unit is disposed on the base or the second end of the supporting component.

11. The keyswitch of claim 1, further comprising:
    a sheltering component disposed on the base, the supporting component passing through the sheltering component to assemble with the guide slot structure;
    a light guiding component, an end of the light guiding component inserting into an opening on the sheltering component; and
    a light emitting unit aligning with the other end of the light guiding component, light generated by the light emitting unit being transmitted out of the sheltering component via the light guiding component.

12. The keyswitch of claim 1, wherein the distance detecting unit actuates a control command of the keyswitch according to varying quantity and/or stop timing of the movement.

13. The keyswitch of claim 1, wherein the distance detecting unit is a resistance detecting component or a capacitance detecting component.

14. A keyboard with a distance detecting function, comprising:
    a base whereon a plurality of guide slot structures is formed; and
    a plurality of keyswitches disposed on the base, each keyswitch comprising:
       a keycap;
       a supporting component, having a first end and a second end opposite to each other, the first end being connected to the keycap and the second end being movably assembled with a corresponding guide slot structure;
       a recovering component disposed between the supporting component and the corresponding guide slot structure; and
       a distance detecting unit detachably disposed on the base and adapted to detect a movement of the keycap relative to the base for determining whether the each keyswitch is actuated.

15. The keyboard of claim 14, wherein the distance detecting unit is an optical detecting component, the optical detecting component detects a characteristic pattern on a working surface, and determines the movement of the keycap relative to the base according to a motion of the characteristic pattern, a deformation of the characteristic pattern or a reflective intensity variation of the working surface.

16. The keyboard of claim 15, wherein the optical detecting component receives an environmental intensity variation outside the keycap via a light guiding component, so as to determine whether an external object is located above the keycap.

17. The keyboard of claim 15, wherein the working surface is formed on a bottom surface of the supporting component, the distance detecting unit is disposed inside the corresponding guide slot structure, and a detecting surface of the distance detecting unit faces toward the bottom surface.

18. The keyboard of claim 15, wherein the supporting component further has a stretching portion, the working surface is formed on the stretching portion, and a detecting surface of the distance detecting unit faces toward the stretching portion.

19. The keyboard of claim 15, wherein the supporting component further has a pushing portion, the each keyswitch further comprises a resilient component disposed on the base and detachably contacting against the pushing portion, a resilient recovering force of the resilient component is applied to the supporting component via the pushing portion.

20. The keyboard of claim 19, wherein the working surface is formed on the resilient component, and a detecting surface of the distance detecting unit faces toward the resilient component.

21. The keyboard of claim 14, wherein the each keyswitch further comprises:
   a light penetrating structure disposed on the base; and
   a light emitting unit aligning with the light penetrating structure, light generated by the light emitting unit being transmitted out of the base via the light penetrating structure.

22. The keyboard of claim 14, wherein the supporting component is made of light guiding material, the each keyswitch further comprises a light emitting unit aligning with the supporting component, and light generated by the light emitting unit is transmitted out of the keycap via the supporting component.

23. The keyboard of claim 22, wherein the light emitting unit is disposed on the base or the second end of the supporting component.

24. The keyboard of claim 14, wherein the each keyswitch further comprises:
   a sheltering component disposed on the base, the supporting component passing through the sheltering component to assemble with the corresponding guide slot structure;
   a light guiding component, an end of the light guiding component inserting into an opening on the sheltering component; and
   a light emitting unit aligning with the other end of the light guiding component, light generated by the light emitting unit being transmitted out of the sheltering component via the light guiding component.

25. The keyboard of claim 14, wherein the distance detecting unit actuates a control command of the each keyswitch according to varying quantity and/or stop timing of the movement.

26. The keyboard of claim 14, wherein the distance detecting unit is a resistance detecting component or a capacitance detecting component.

27. The keyboard of claim 14, wherein the plurality of keyswitches utilizes correctional function to simultaneously adjust detective precision of the distance detecting unit.

* * * * *